US007279909B1

(12) United States Patent
Abdelli (10) Patent No.: US 7,279,909 B1
(45) Date of Patent: Oct. 9, 2007

(54) SIGNAL COINCIDENCE DETECTION CIRCUIT

(75) Inventor: Said E. Abdelli, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/408,870

(22) Filed: Apr. 20, 2006

(51) Int. Cl.
*G01R 27/08* (2006.01)
(52) U.S. Cl. ...................... 324/705; 324/656
(58) Field of Classification Search ............ 324/76.11, 324/76.74, 705, 656
See application file for complete search history.

(56) References Cited

U.S. PATENT DOCUMENTS

| | | | | |
|---|---|---|---|---|
| 4,602,167 | A | * | 7/1986 | Yukawa ...................... 327/65 |
| 5,999,054 | A | * | 12/1999 | Suzuki ....................... 330/255 |
| 6,252,434 | B1 | * | 6/2001 | Nag et al. ................... 327/65 |

* cited by examiner

*Primary Examiner*—Walter Benson (74) *Attorney, Agent, or Firm*—McDonnell Boehnen Hulbert & Berghoff LLP (57) ABSTRACT

Signal coincidence detection circuits and methods implemented in such circuits are disclosed. An example signal coincidence detection circuit includes a first differential transistor pair, a second differential transistor pair coupled with the first differential transistor pair and a third differential transistor pair coupled with the first differential transistor pair in parallel with the second differential transistor pair. The circuit also includes a first input signal terminal coupled with the first, second and third differential transistor pairs, wherein, in operation, the first input signal terminal receives a first input signal that is communicated to the first, second and third differential transistor pairs. The circuit further includes a second input signal terminal coupled with the first, second and third differential transistor pairs, wherein, in operation, the second input signal terminal receives a second input signal that is communicated to the first, second and third differential transistor pairs. The circuit additionally includes a current source coupled with the first differential transistor pair, where, in operation, a plurality of currents of the second and third differential transistor pairs are combined such that the combined currents indicate whether or not coincidence between the first and second input signals exists.

20 Claims, 10 Drawing Sheets

SIGNAL COINCIDENCE DETECTION CIRCUIT

BACKGROUND

1. Field

This disclosure relates to signal coincidence detection circuits.

2. Description of Related Art

In analog circuits it is often desirable to determine when two signals are coincident. For purposes of this disclosure, coincidence (or signal coincidence) means that two (or more) voltage signals have substantially the same voltage amplitude at substantially the same point in time. For instance, such (signal) coincidence may be established when the signals being compared are all within a certain range relative to each other (e.g., within a certain percentage or within a certain difference in amplitude). For instance, in a particular embodiment, two signals may be considered to be coincident if they have voltage amplitudes that are within 100 mV of each other. The 100 mV difference may be termed a "coincidence band" or "band of coincidence." In such an embodiment, a voltage signal of 2.9 V would be considered to be coincident with a voltage signal of 2.95 V, while the signal of 2.9 V would not be considered coincident with a voltage signal of 2.85 V. As is known, such signal coincidence may be determined using a signal coincidence detection circuit.

An example application for such signal coincidence detection circuits is their use to determine "lock" of bandgap reference circuits. Bandgap reference circuits are known and will not be described in detail here. Briefly, however, bandgap reference circuits are used to provide stable voltage references in low-voltage circuits (e.g., ~1.2 V). Additionally, bandgap reference circuits may be used to provide local biases in very large scale integrated circuits. Local biases generated by such bandgap circuits are desirable because they are not substantially affected by ambient noise or transient signals. Bandgap circuits are feedback circuits where a reference signal is applied and a feedback signal is generated based on the reference signal. The bandgap circuit is considered to be "locked" when the feedback signal is coincident (e.g., within a band of coincidence) with the reference signal. As indicated above, such coincidence may be determined using a signal coincidence detection circuit. However, current approaches for implementing such signal coincidence detection circuits have certain drawbacks.

For instance, current embodiments of signal coincidence detection circuits are fairly complicated analog circuits (e.g., including fifty or more transistors). Such circuits include a series of comparators, where shifts in the threshold of the comparators are used to establish a coincidence band for the signals being compared by the circuit. Such signal coincidence detection circuits also include logic circuitry that is used to determine coincidence between signals of interest (e.g., a reference signal and a feedback signal of a bandgap reference circuit) based on signals that are generated by the series of comparators from the signals of interest. However, because of their complexity, such signal coincidence detection circuits have relatively high power dissipation, may operate slowly and are difficult to design.

Furthermore, it may be desirable to establish a threshold voltage for coincidence detection (e.g., a voltage level below which coincidence of signals being compared will not be indicated) so that coincidence of the signals being compared that occurs below the threshold voltage is not indicated. In such an approach, additional circuitry is needed for setting such a threshold. Such threshold circuitry thus further increases the design complexity and power dissipation of such circuits. Based on the foregoing, alternative approaches for implementing such signal detection circuits are desirable.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are given by way of example and meant to be illustrative, not limiting in scope. In various embodiments, one or more of the above-described problems have been reduced or eliminated, while other embodiments are directed to other improvements.

Embodiments of signal coincidence detection circuits that overcome at least some of the foregoing described shortcomings of current approaches are disclosed. In one embodiment of a signal coincidence detection circuit, an example circuit includes a first differential transistor pair, a second differential transistor pair that is coupled with the first differential transistor pair and a third differential transistor pair that is coupled with the first differential transistor pair in parallel with the second differential transistor pair.

The circuit further includes a first input signal terminal that is coupled with the first, second and third differential transistor pairs. In operation, the first input signal terminal receives a first input signal that is communicated to the first, second and third differential transistor pairs (e.g., gates of transistors of the differential transistor pairs). The circuit also includes a second input signal terminal that is also coupled with the first, second and third differential transistor pairs. The second input signal terminal receives a second input signal that is also communicated to the first, second and third differential transistor pairs (e.g., gates of transistors of the differential transistor pairs).

The circuit still further includes a current source that is coupled with the first differential transistor pair. The current source provides a tail current to the first differential transistor pair. Tail currents are provided to the second and third differential transistors pairs by respective transistors of the first differential transistor pairs.

In operation, a plurality of currents of the second and third differential transistor pairs are combined such that the combined currents indicate whether or not coincidence between the first and second input signals exists. For instance, the combined currents (e.g., two combined currents) may be used to drive pull-up and pull-down devices (e.g., through current mirrors). The pull-up and pull-down devices may then be coupled with a signal buffer (e.g., an inverter or hex buffer) such that the signal buffer produces a digital signal that indicates whether or not the first and second input signals are coincident. For instance, a logic "1" that is produced by the signal buffer may indicate coincidence of the signals while a logic "0" that is produced by the signal buffer may indicate non-coincidence of the signals. Of course, the opposite may also be the case with a logic "0" indicating coincidence and a logic "1" indicating lack of coincidence.

The example circuit also includes a threshold adjustment device that is coupled with the second and third differential pairs and a pull-up device of the circuit. The threshold adjustment device is further coupled to the current source in a parallel arrangement with the first, second and third differential pairs. In the example circuit, the threshold adjustment device takes the form of an n-type field effect transistor (FET) that acts as current steering device where a source terminal of the FET is coupled with the current source and a drain terminal of the FET is coupled with the second and third differential pairs and the pull-up device.

By applying a voltage to the gate of the n-type FET, current from the current source for input signals with amplitudes below the voltage applied to the gate of the FET (because of its parallel arrangement with the differential pairs) is "steered" away from the pull-up device. Thus, the threshold voltage of the signal coincidence detection circuit is substantially equal to the voltage applied to the gate of the threshold adjustment device. In this situation, signal coincidence that occurs below the threshold voltage will not be indicated by the signal coincidence detection circuit because the current from the current source is steered away from the pull-up device. However, signal coincidence for input signals above the threshold voltage will be indicated by the signal coincidence detection circuit because only a portion of the current from current source (via the first, second and third differential transistor pairs) will be steered away from the pull-up device.

Methods for determining signal coincidence may be implemented using a circuit such as the circuit described above. One such example method includes receiving a first input signal, receiving a second input signal and applying the first and second input signals to the first, second and third differential transistor pairs of the circuit. As discussed above, a tail current of the first differential transistor pair is provided by a current source, a tail current of the second differential transistor pair is provided by a first transistor of the first differential transistor pair and a tail current of the third differential transistor pair is provided by a second transistor of the first differential transistor pair.

The method further includes combining currents of the second and third differential transistor pairs to produce first and second combined currents and communicating the first and second combined currents to a signal buffer, such as by current mirroring. In the example method, the signal buffer produces a digital signal based on the first and second combined currents, where the digital signal indicates whether or not the first and second input signals are coincident, such as in the manners discussed above. The method may also include establishing a threshold voltage in the manner described above.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

Embodiments of signal coincidence detection circuits and methods that may be implemented by such circuits are shown and described generally herein. As was discussed above, such circuits may be used in any number of applications. It will be appreciated that the particular circuit elements of a specific embodiment will depend, at least in part, on the particular application for which a specific signal coincidence detection circuit is intended.

Signal Coincidence Circuit with Adjustable Threshold

Figure 1:
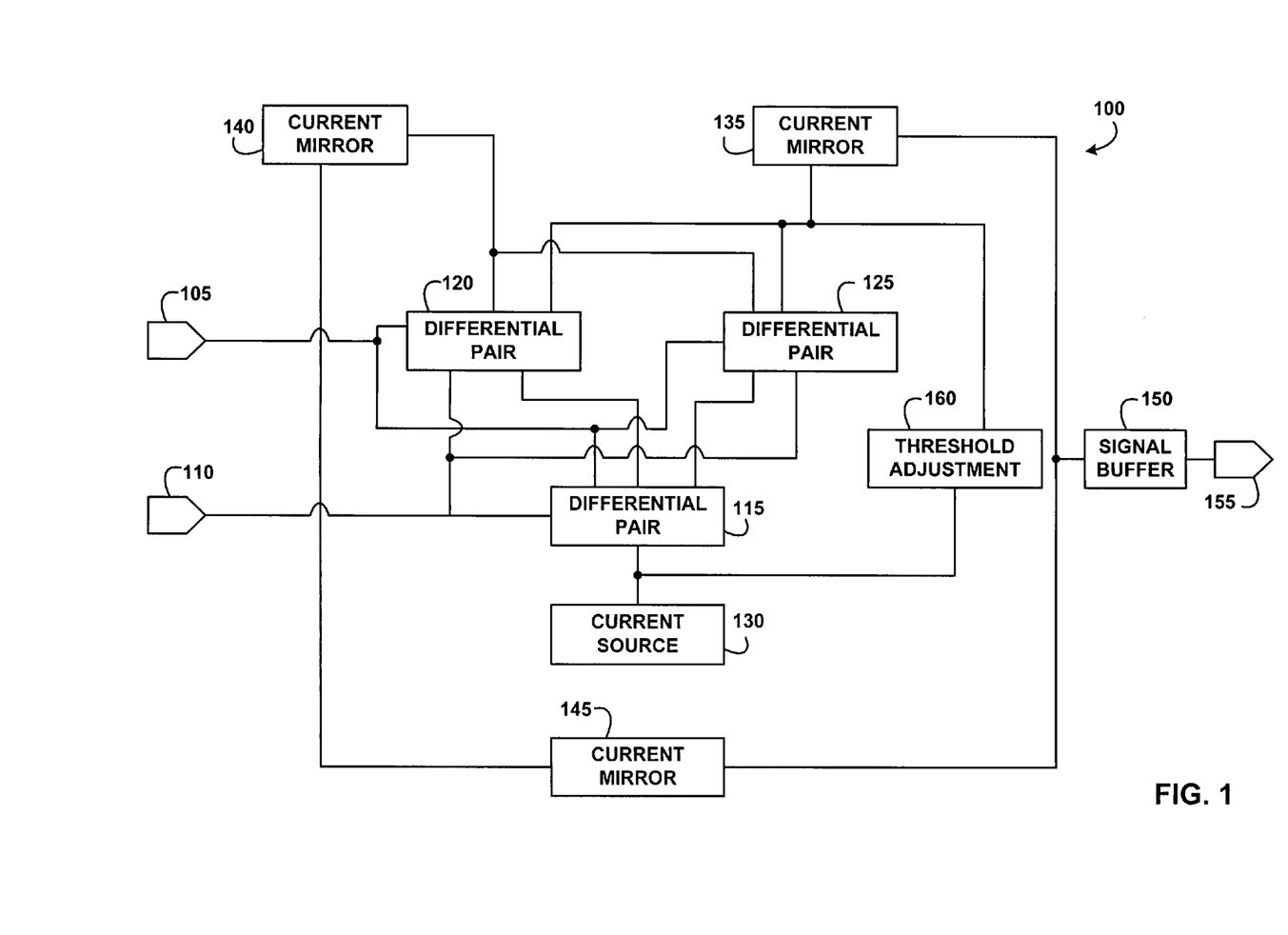
FIG. 1 is a block diagram of a signal coincidence detection circuit with adjustable threshold.

Referring to FIG. 1, a block diagram illustrating an example signal coincidence detection circuit 100 is shown. The circuit 100 includes a first input signal terminal 105 and a second input signal terminal 110. The input signal terminals 105,110 are coupled with a first differential transistor pair 115, a second differential transistor pair 120 and a third differential transistor pair 125. In operation, the first input signal terminal 105 receives a first input signal and the second input signal terminal 110 receives a second input signal. The signal coincidence detection circuit 100 determines whether or not the first and second input signals are coincident.

To determine whether the first and second input signals are coincident, the first and second input signals are communicated from the input signal terminals 105,110 to the first, second and third differential pairs 115,120,125. In comparing the first and second input signals for coincidence, a first tail current is provided to the first differential pair 115 by a current source 130. The first differential pair 115, in turn, provides a second tail current to the second differential transistor pair 120 (e.g., via a first transistor) and a third tail current to the third differential transistor pair 125 (e.g., via a second transistor). The second and third tail currents are based on the first and second input signals.

The second and third differential pairs 120,125 produce a plurality of currents (from the second and third tail currents) based on the first and second input signals. For the circuit 100, the currents produced by the second and third differential transistor pairs 120,125 are combined to produce two combined currents. To produce the combined currents, respective drain terminals of transistors of the second and third differential transistors pairs 120,125 are coupled to one another.

A first combined current is communicated to a current mirror 135. The current mirror 135 operates as a pull-up device in the circuit 100. A second combined current is communicated to a current mirror 140. The current mirror 140 mirrors the second combined current and communicates that mirrored current to another current mirror 145. The current mirror 145 operates as a pull-down device in the circuit 100. The first and second combined currents are then communicated (via the current mirrors 135,140,145) to a signal buffer 150.

The signal buffer 150 produces a digital signal based on the first and second combined currents, where the digital signal produced by the signal buffer 150 indicates whether the first and second input signals are coincident (e.g., within a band of coincidence). For instance, the signal buffer 150 may generate a logic "1" signal to indicate that the first and second input signals are coincident and generate a logic "0" signal to indicate that the first and second input signals are not coincident. Of course, the opposite may also be the case, where a logic "0" indicates that the input signals are coincident and a logic "1" indicates that the input signals are not coincident. It will be appreciated that, the signal buffer 150 may take any number of forms. For example, the signal buffer 150 may be implemented as an inverter or, alternatively, as a hex buffer. The digital signal produced by the signal buffer 150 may then be communicated to other circuitry via an output signal terminal 155.

The signal coincidence detection circuit 100 further includes a threshold adjustment device 160. The threshold adjustment device 160 is coupled with the second and third differential pairs and the current mirror 135. In the circuit 100, the threshold adjustment device 160 acts as a current "steering" device. Current is "steered" from the current source 130 (via the differential transistor pairs 115,120,125) by applying a threshold voltage to the threshold adjustment device 160.

In such an approach, the threshold adjustment device 160 may take the form of an n-type field effect transistor (FET) that is coupled in parallel with the differential transistor pairs 115,120,125, where a source terminal of the FET is coupled with the current source and a drain terminal of the FET is coupled with the second and third differential pairs and the current mirror 135. Further, the threshold voltage would be applied to a gate terminal of the FET.

In such a circuit, current produced by the current source 130 (and communicated through the differential transistor pairs 115,120,125) would be "steered" through the threshold adjustment device 160 (and away from the current mirror 135) when the first and second input signals have voltage amplitudes that are at or below the threshold voltage applied to the threshold adjustment device 160. However, for input signals that have voltage amplitudes greater than the applied threshold voltage, only a relatively small portion of the current is "steered" through the threshold adjustment device 160. The portion of the current that is not "steered" through the threshold adjustment device 160 is communicated to the current mirror 135 and, in turn, to the signal buffer 150. This current "steering" results in the circuit 100 only indicating the coincidence of the first and second input signals when the voltage amplitude of those input signals exceeds the threshold voltage applied to the threshold adjustment device 160 (e.g., the voltage applied to the gate of the n-type FET used to implement the threshold adjustment device 160).

Figure 2:
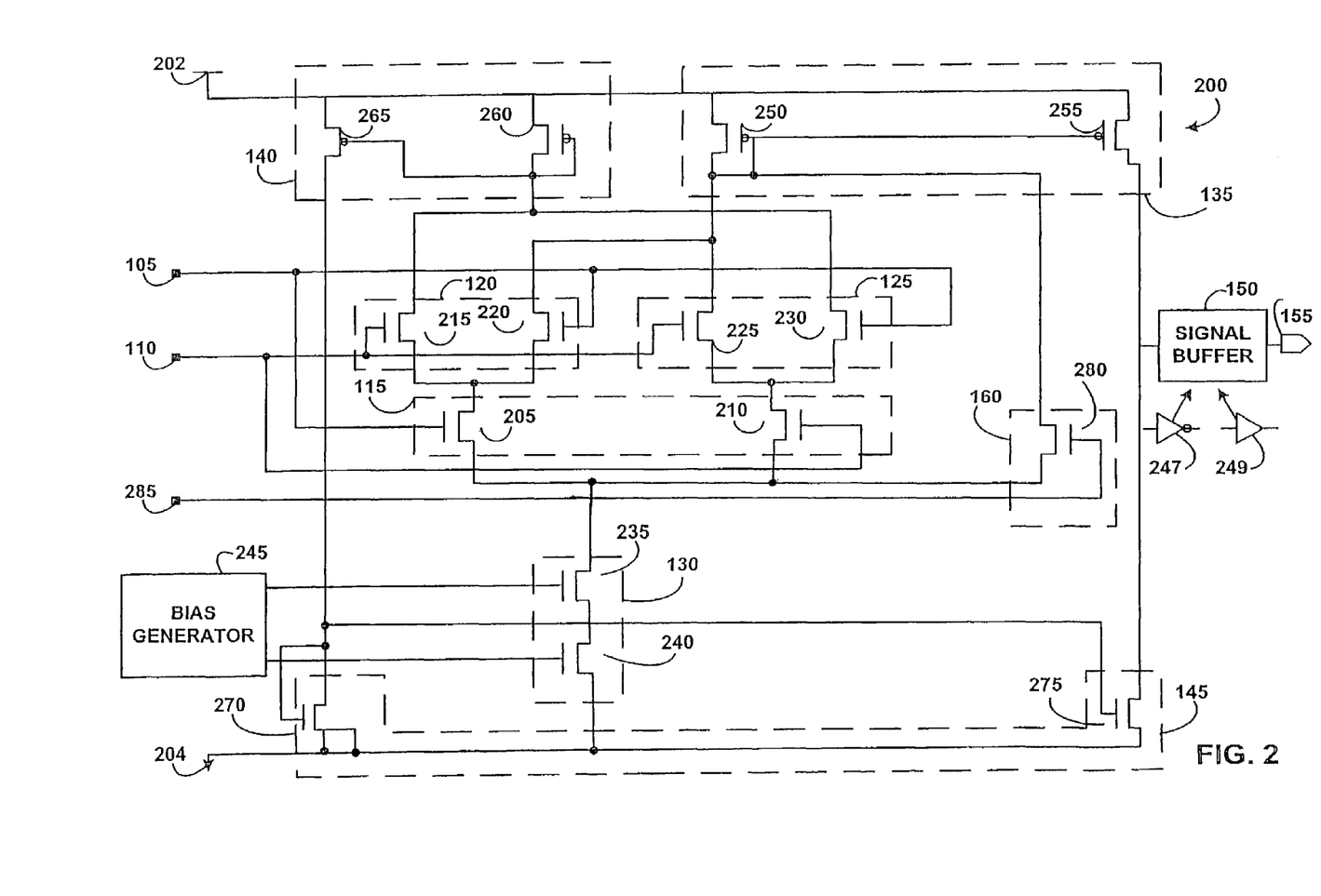
FIG. 2 is a schematic/block diagram illustrating, in further detail, a signal coincidence detection circuit with adjustable threshold.

Referring now to FIG. 2, a schematic diagram illustrating, in more detail, a signal coincidence detection circuit 200 is shown. The circuit 200 includes like elements with the circuit 100 shown in FIG. 1. The like elements in FIG. 2 are referenced with the same reference numbers as the corresponding elements in FIG. 1. For purposes of brevity and clarity, the details of the circuit 100 that were described above with reference to FIG. 1 will not be repeated with reference to FIG. 2 except to the extent needed to describe the additional details of the circuit 200. It will be appreciated, however, that the additional details of the circuit 200 may also be included in the circuit 100 but have not been shown in FIG. 1 for purposes of clarity.

The circuit 200 includes a power supply terminal 202 that is used communicate an appropriate power supply voltage to the components of the circuit 200. Likewise, the circuit 200 also includes an electrical ground terminal 204 to provide a ground reference to the components of the circuit 200. In the circuit 200, the first differential transistor pair 115 includes a first n-type FET 205 and a second n-type FET 210. The source terminals of the FETs 205,210 are coupled with one another. The second differential pair 120 includes a first n-type FET 215 and a second n-type FET 220, where the source terminals of the FETs 215,220 are coupled with one another. In like fashion, the third differential transistor pair 125 includes a first n-type FET 225 and a second n-type FET 230, where the source terminals of the FETs 225,230 are coupled with one another.

The drain terminal of the FET 205 of the first differential pair 115 is coupled with the source terminals of the FETs 215,220 of the second differential pair 120 and, as noted above, provides a tail current to the second differential pair 120. In similar fashion, the drain terminal of the FET 210 of the first differential pair 115 is coupled with the source terminals of the FETs 225,230 of the third differential pair 125 and provides a tail current to the third differential pair 125.

As shown in FIG. 2, the source terminals of the respective FETs of the differential pairs 115,120,125 are coupled directly to one another. In such an embodiment, the band of coincidence (as was discussed above) for the circuit 200 would be established by adjusting the size of the FETs of the differential pairs 115,120,125. In other embodiments, the coincidence band may also be established using a technique that may be termed resistive degeneration. In such an approach, rather than coupling the source terminals of the respective FETs of each differential pair 115,120,125 directly to each other, resistors are inserted between the source terminals. Such an approach allows for "tuning" of the coincidence band and also increases the linearity of the signal coincidence detection circuit. Resistive degeneration does, however, result in a reduction of the gain of such a signal coincidence detection circuit. Therefore, the particular approach used for establishing a coincidence band will depend on the intended application of a particular signal coincidence detection circuit.

Figure 3:
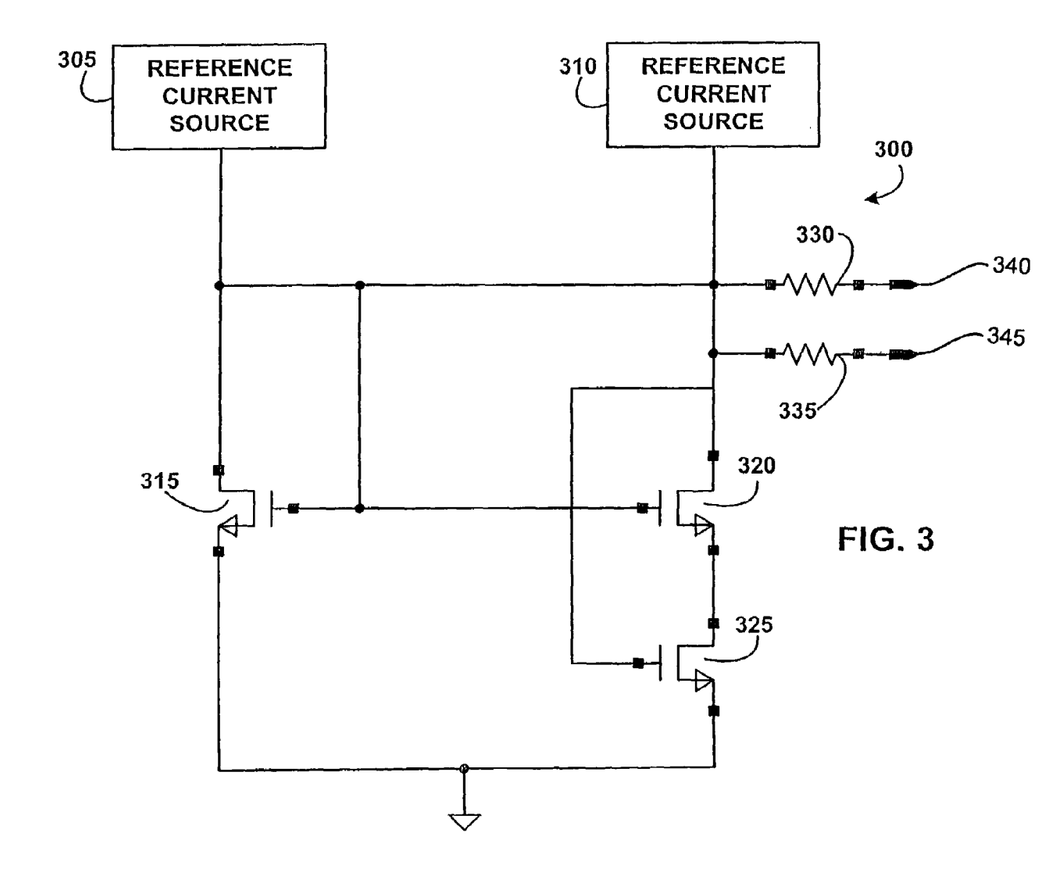
FIG. 3 is a schematic/block diagram of a cascoded bias generator circuit that may be implemented in the circuits of FIGS. 1 and 2.

The current source 130 of the circuit 200 includes a first n-type FET 235 and a second n-type FET 240 The FETs 235,240 are coupled in a stacked arrangement with the drain of the FET 235 being coupled with the source terminals of the FETs 205 and 210 of the differential pair 115. The source terminal of the FET 235 is coupled with the drain terminal of the FET 240 and the source terminal of the FET 240 is coupled with the electrical ground reference terminal 204. The gate terminals of the FETs 235,240 of the current source 130 are coupled with a bias generator 245, which provides two direct-current voltage biases to the current source 130. The current source 130 uses these voltage biases to "mirror" current references provided to the bias generator 245. The bias generator 245 may take any number of forms. For instance, the bias generator may be implemented as a cascoded bias generator, such as a bias generator is illustrated in FIG. 3 and described below.

As shown in FIG. 2, and as was described above, the signal buffer 150 may be implemented as an inverter 247. As an alternative, the signal buffer 150 may be implemented as a hex buffer 249. Other possibilities also exist. For instance, the signal buffer 150 may be implemented as a series of inverters or hex buffers. It will be appreciated that such an approach may provide additional noise immunity as compared to the use of a single inverter or hex buffer.

In the circuit 200, drain terminals of the second FET 220 of the second differential pair 120 and the first FET 225 of the third differential pair are coupled with each other. The drain terminals of the FETs 220,225 are further coupled with the current mirror 135, which acts as a pull-up device in the circuit 200. Because the drain terminals of the FETs 220,225 are coupled with each other, the currents produced by the FETs 220,225 are combined and communicated to the current mirror 135 (assuming the threshold adjustment device 160 is off).

The current mirror 135 includes a first p-type FET 250 and a second p-type FET 255. The combined current from the FETs 220,225 is communicated to the FET 250. The combined current is then mirrored by the FET 255 and the mirrored current is communicated to the signal buffer 150.

Also in the circuit 200, drain terminals of the first FET 215 of the second differential pair 120 and the second FET 230 of the third differential pair 125 are coupled with each other such that the FETs 215,230 produce a second combined current. The second combined current is communicated to the current mirror 140. The current mirror 140 includes a first p-type FET 260 and a second p-type FET 265. The second combined current is communicated to the FET 260. The second combined current is then mirrored by the FET 265 and communicated to the current mirror 145, which acts as a pull-down device in the circuit 200.

The current mirror 145 includes a first n-type FET 270 and a second n-type FET 275. The mirrored current from the current mirror 140 is communicated to the transistor 270, which operates as a diode in the circuit 200. The current is then again mirrored by the FET 275 and communicated to the signal buffer 150.

The signal buffer 150 produces a digital signal based on the currents communicated to it by the FETs 255,275. This digital signal indicates whether or not the first and second input signals applied to the input signal terminals 105,110 of the circuit 200 are coincident. If the signal buffer 150 in the circuit 200 is implemented as an inverter, the digital signal produced by the circuit 200 will be a logic "1" when the first and second input signals are coincident, while the digital signal will be a logic "0" when the input signals are not coincident.

As shown in FIG. 2, the threshold adjustment device 160 is implemented as an n-type FET 280, which acts as a current steering device when establishing a threshold voltage for the circuit 200. The threshold voltage is applied to a gate terminal of the FET 280 via a threshold voltage input terminal 285. When a threshold voltage other than 0 V is applied to the threshold voltage input terminal 285, the combined current produced by the FETs 235,240 is "steered" through the FET 280 when the amplitude of the input signals applied to the input terminals 105,110 is at or below the threshold voltage, as was discussed above. As was also discussed above, when the amplitude of the input signals is greater than the threshold voltage, only a relatively small portion of the combined current of the FETs 235,240 is "steered" through the FET 280. The remaining portion is communicated to the signal buffer 150 via the current mirror 135 and used to produce the digital signal to indicate the coincidence of the first and second input signals.

Cascoded Bias Generator

FIG. 3 illustrates a cascoded bias generator 300 that may be implemented as the bias generator 245 in the signal coincidence detection circuit 200 of FIG. 2. The cascoded bias generator 300, in operation, provides voltage biases to drive the transistors 235,240 of the current source 130 via respective series resistors 330,335 of the bias generator 300. The transistors 235,240 mirror current reference signals provided to the cascoded bias generator 300 by reference current sources 305,310. These voltage biases are communicated to the transistors 235,240 via, respective output terminals 340,345 of the cascoded bias generator 300.

Such cascoded bias generator circuits are known. Therefore, for the purposes of brevity, the operation of such circuits will not be described in detail here. Briefly, however, the bias generator 300 includes n-type FETs 315, 320 and 325. The bias generator produces voltage biases from the reference currents provided by the current sources 305,310 using the n-type FETs 315, 320 and 325. These biases are communicated to the current source 130 of the circuit 200, which mirrors the currents provided by the reference current sources 305,310.

Operation of Signal Coincidence Detection Circuit

Referring to FIGS. 4A-4E with further reference to FIG. 2, graphs 400,410,420,430,440 are shown illustrating circuit simulation results of the relationship of current in the first, second and third differential transistor pairs 115,120,125 of the circuit 200 to a first input signal 402 and a second input signal 404, which are applied, respectively to the input terminals 105,110.

In FIGS. 4A-4E, the first input signal 402 has a voltage that is equal to a variable voltage 'VA.' The voltage 'VA' is represented on the x-axis of each of the graphs 400,410, 420,430,440. Also, in the graphs of FIGS. 4A-4E, the second input signal 404 has a voltage that is equal to '2.0-VA' For the simulation results shown in the graphs 400,410,410,430, 440, the variable voltage 'VA' is linearly swept from 0 V to 2 V, which results in the first input signal 402 and the second input signal 404 being inverses of one another. The actual amplitudes of the first and second input signals 402,404 are shown the left vertical 'Voltage' axis in each Figure. It will be appreciated that the input signals 402 and 404 are merely illustrative to demonstrate the operation of the circuit 200 and any number of forms of input signals may be communicated to the circuit 200 to determine signal coincidence.

Figure 4A:
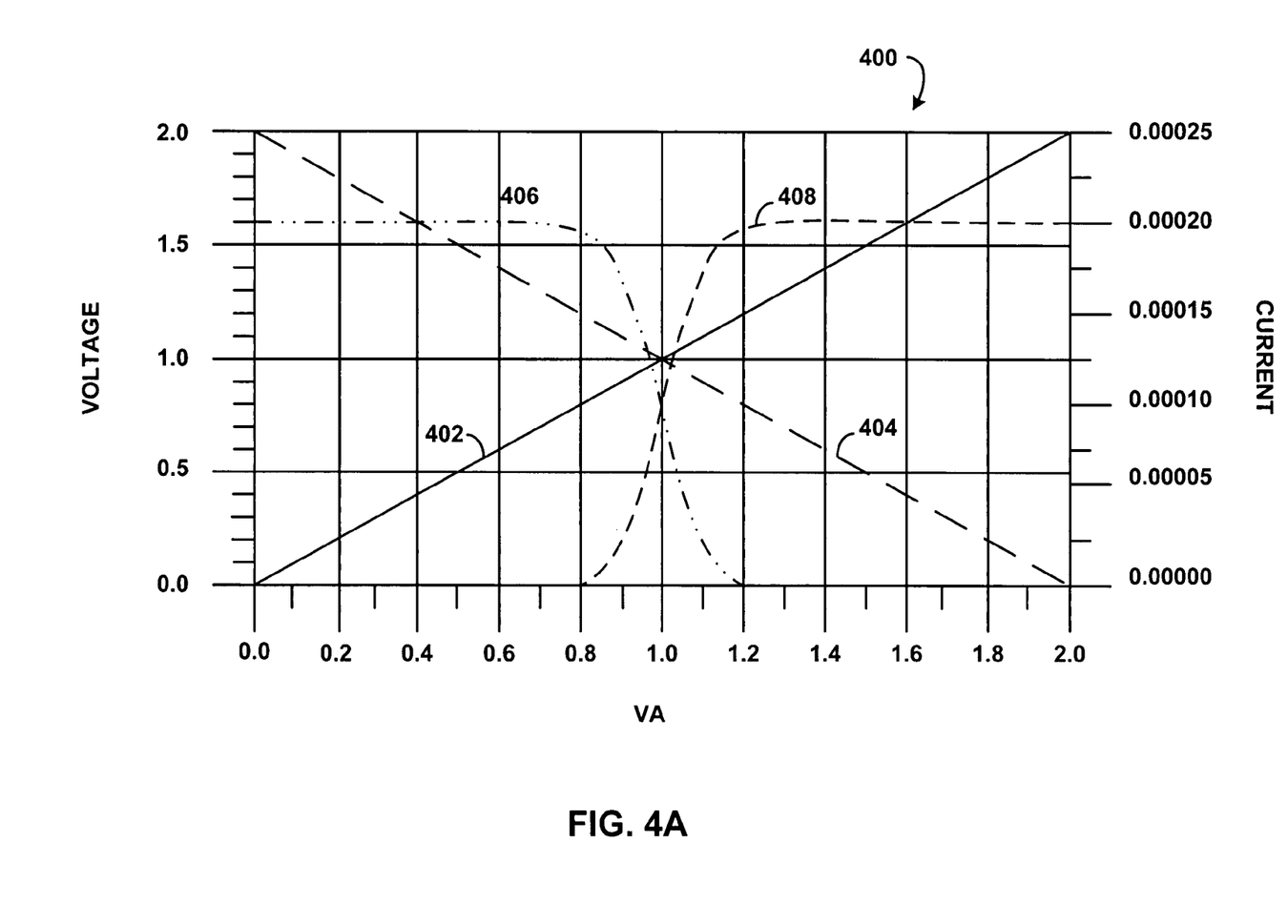
FIGS. 4A-4E are graphs illustrating voltage and current relationships for the circuit of FIG. 2.

The graph 400 of FIG. 4A illustrates the relationship of the currents of the FETs 205 and 210 of the first differential pair 115 of the circuit 200 to the first and second input signals 402,404. In the graph 400, the current through the FET 205 is represented by the line 408 and the current through the FET 210 is represented by the line 406. The magnitude of the currents 406,408 are shown in the right vertical 'Current' axis. The currents through the FETs 205, 210 are provided by the current source 130, where the sum of those currents 406,408 at any given point in the graph 400 is the tail current of the first differential pair 115. As shown by the graph 400, the tail current (the sum of the currents 406,408) of the differential pair 115 is constant over the 2.0 V range illustrated.

In the circuit 200, the first input signal 402 is applied to a gate terminal of the FET 205 of the first differential pair 115 and the second input signal 404 is applied to the FET 210 of the first differential pair 115. When VA is 0 V, the first input signal 402 is also 0 V and the second input signal is 2.0 V. In this situation, the FET 210 is turned on and the FET 205 is turned off. Therefore, the tail current provided by the current source 130 is substantially completely conducted by the FET 210. As the variable voltage VA is increased, the FET 205 begins to turn on and the FET 210 begins to turn off. This causes the current 406 through the FET 210 to decrease and the current 408 through the FET 205 to increase. When VA reaches approximately 1.15 V, the tail current provided by the current source 130 is substantially completely conducted by the FET 215 and the current 406 is approximately zero. As shown in FIG. 4A, this transition occurs in the approximate range of VA=0.85 V–1.15V. In this range, the first input signal 402 and the second input signal 404 also cross (have coincidence). The current 408

(through the FET 205) is provided to the second differential pair 120 and serves as the tail current for that differential pair. Likewise, the current 406 (through the FET 210) is provided to third differential pair 125 and serves as the tail current for that differential pair.

Figure 4B:
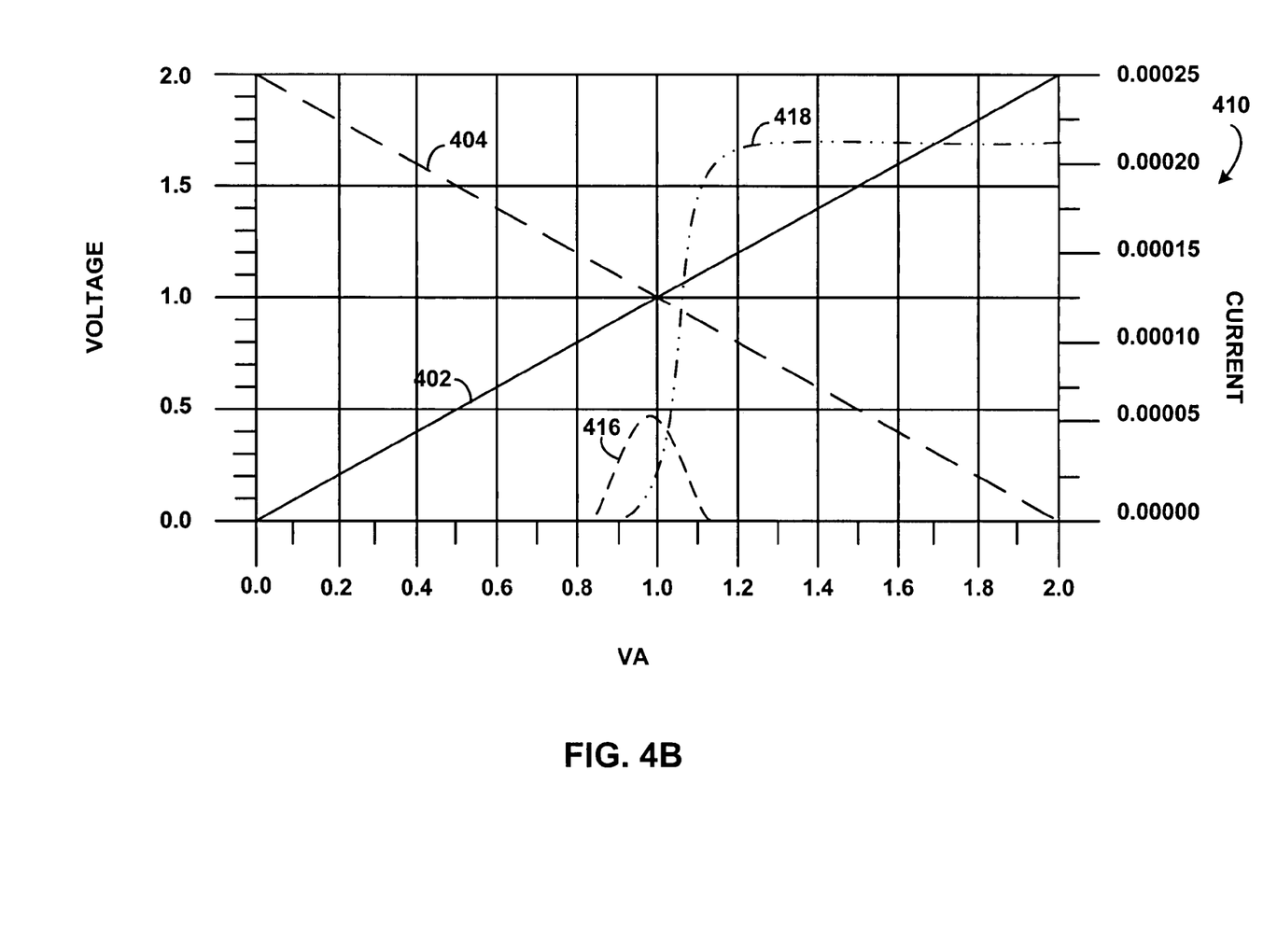

The graph 410 of the FIG. 4B illustrates the relationship of the currents of the FETs 215 and 220 of the second differential pair 120 of the circuit 200 to the first and second input signals 402,404. It will be appreciated that the currents of the FETs 215,220 are based on the tail current (the current 408 of FIG. 4A) of the second differential pair 120.

In the circuit 200, the first input signal 402 is applied to a gate terminal of the FET 220 of the second differential pair 120 and the second input signal 404 is applied to the FET 215 of the second differential pair 120. In the graph 410, the current 416 is the current through the FET 215 and the current 418 is the through the FET 220. For the circuit 200, when VA is 0 V, the first input signal 402 is also 0 V and the second input signal 404 is 2.0 V. In this situation, the FET 215 is turned on and the FET 220 is turned off. However, when VA is 0 V, the tail current of the second differential pair 120 (the current 408 of FIG. 4A) is also approximately zero. Therefore, the current 416 through the FET 215 is substantially zero in this situation.

As the variable voltage 'VA' is increased, the FET 215 begins to turn off and the FET 220 begins to turn on. Also, the tail current (the current 408 of FIG. 4A) of the second differential pair 120 also begins to increase. As shown in FIG. 4B, the current 416 through the FET 215 begins to increase in correspondence with the increase in the current 408 but then returns to zero. This occurs because the FET 215 shuts off as the input signal 404 applied to its gate falls below the threshold of the FET 215 as the current 408 continues to increase.

As 'VA' increases causing the FET 220 to turn on, the current 418 increases in correspondence with the tail current (the current 408) of the second differential pair. Once the FET 215 is "fully" turned off and the FET 220 is "fully" turned on (e.g., when VA reaches approximately 1.1V), the current 418 through FET 220 is substantially equivalent to the tail current (the current 408) of the second differential pair 120.

Figure 4C:
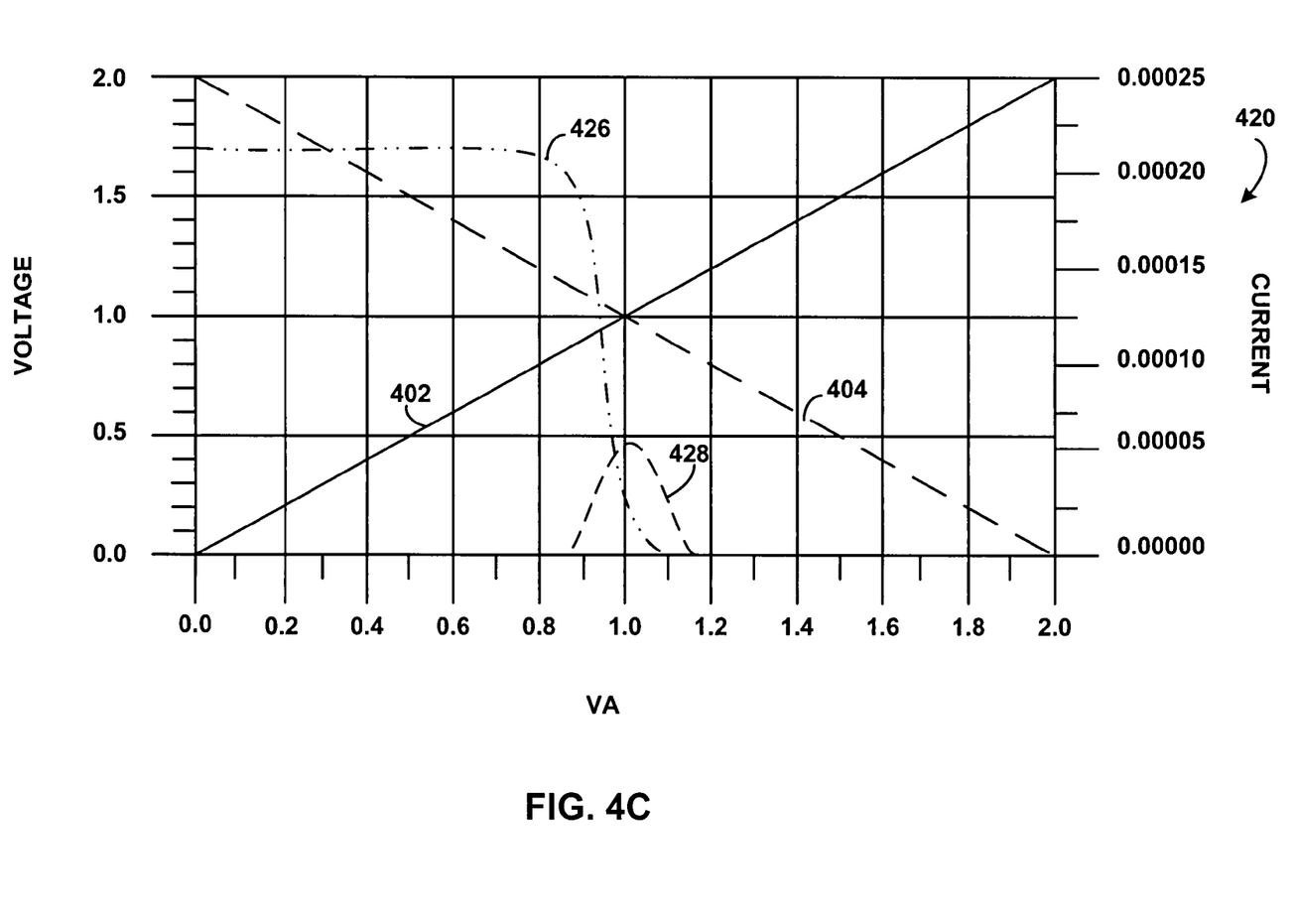

The graph 420 of the FIG. 4C illustrates the relationship of currents 426,428 of the FETs 225 and 230 of the third differential pair 125 to the first and second input signals 402,404. It will be appreciated that the currents 426,428 of the FETs 225,230 are based on the tail current (the current 406 of FIG. 4A) of the third differential pair 125.

In the circuit 200, the first input signal 402 is applied to a gate terminal of the FET 230 of the third differential pair 125 and the second input signal 404 is applied to the FET 225 of the third differential pair 125. In the graph 420, the current 426 is the current through the FET 225 and the current 428 is the current through the FET 230. When VA is 0 V, the first input signal 402 is also 0 V and the second input signal 404 is 2.0 V. In this situation, the FET 225 is turned on and the FET 230 is turned off. Also, when VA is 0 V the tail current of the third differential pair 120 (the current 406 of FIG. 4A) is at its upper value. Therefore, the current 426 through the FET 225 is substantially equivalent to the upper value of the tail current (the current 406) of the third differential pair 125.

As the variable voltage 'VA' is increased, the FET 225 begins to turn off and the FET 230 begins to turn on. Also, the tail current (the current 406 of FIG. 4A) of the third differential pair 125 begins to decrease. As shown in FIG. 4C, the current 426 through the FET 225 begins to decrease in correspondence to the current 406. Further, as the FET 230 begins to turn on (around 0.9V), the current 428 through the FET 230 begins to increase but then returns to zero. This occurs because the tail current (the current 406) of the third differential pair 125 continues to decrease to zero as 'VA' continues to increase.

Figure 4D:
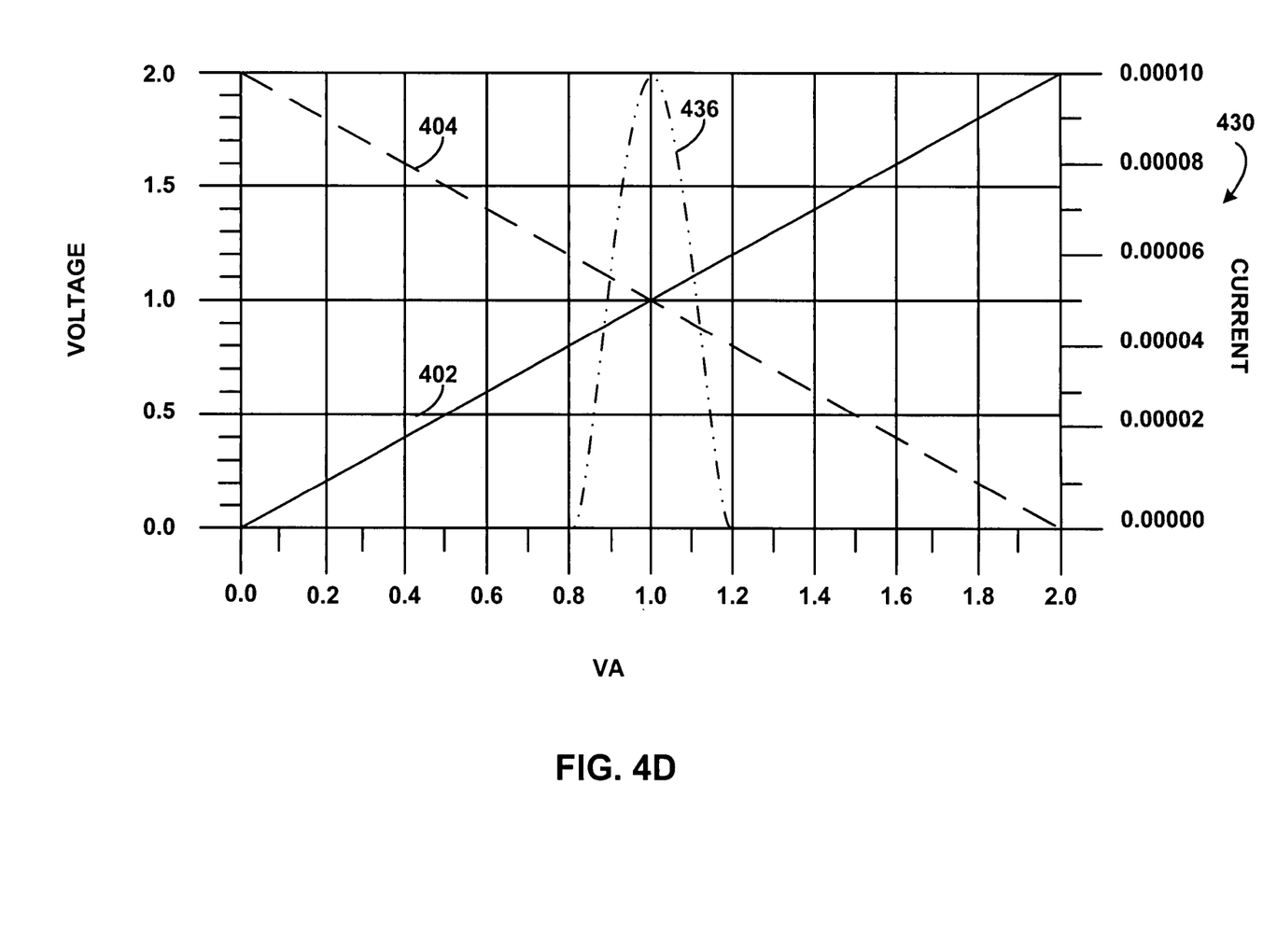

The graph 430 in FIG. 4D shows a combined current 436 and its relationship to the input signals 402,404. The combined current 436 is a combination of the current 416 of the FET 215 and the current 428 of the FET 230. The currents 416,428 are combined by coupling the drain terminals of the FETs 215,230 with each other. The combined current 436 is communicated to the signal buffer 150 via the current mirrors 140,145 in the fashion described above for use in indicating whether or not the first and second input signals 402,404 are coincident.

Figure 4E:
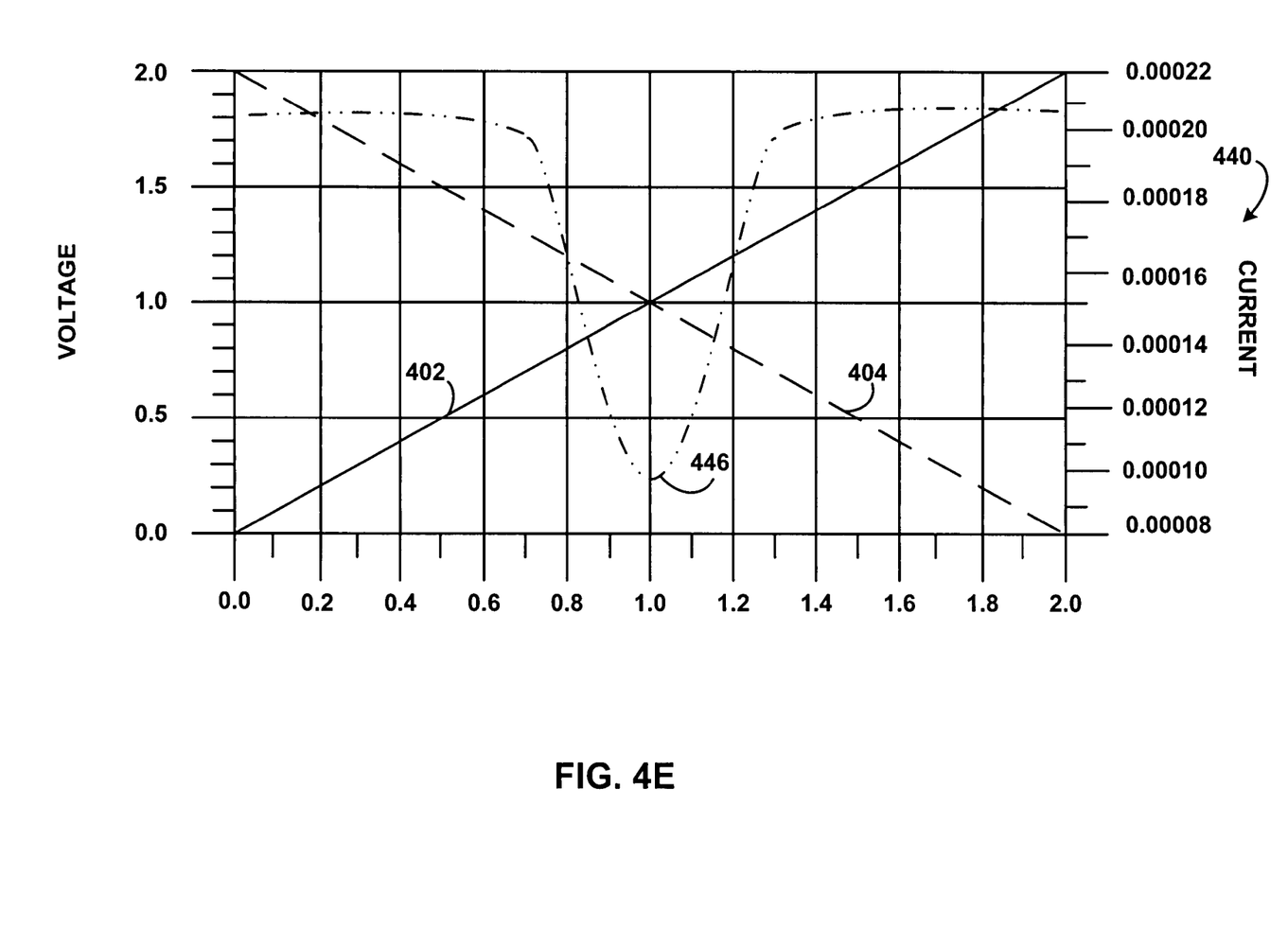

The graph 440 in FIG. 4E shows a combined current 446 and its relationship to the input signals 402,404. The combined current 446 is a combination of the current 418 of the FET 220 and the current 426 of the FET 225. The currents 418,426 are combined by coupling the drain terminals of the FETs 220,225 with each other. The combined current 446 is communicated to the signal buffer 150 via the current mirror 135 in the fashion described above for use in indicating whether or not the first and second input signals 402,404 are coincident.

As shown in FIGS. 4D and 4E, when the first input signal 402 and the second input signal 404 are coincident, the combined current 436 is at an upper value and the combined current 446 is at a low value. These currents are communicated to the signal buffer 150 (via the current mirrors 135,140,145) to indicate coincidence. The width of the vertical portion of the traces representing the currents 436, 446 around the coincidence of the input signals 402,404 (e.g., in the range of VA=0.9V to 1.1V) corresponds with the coincidence band for the circuit 200. The exact range of the coincidence band will depend on the particular embodiment.

For values of 'VA' outside the coincidence band, the current 436 is at (or approaching) its low value and the current 446 is at (or approaching) its upper value. These currents are communicated to the signal buffer 150 (via the current mirrors 135,140,145) to indicate lack of coincidence.

Figure 5:
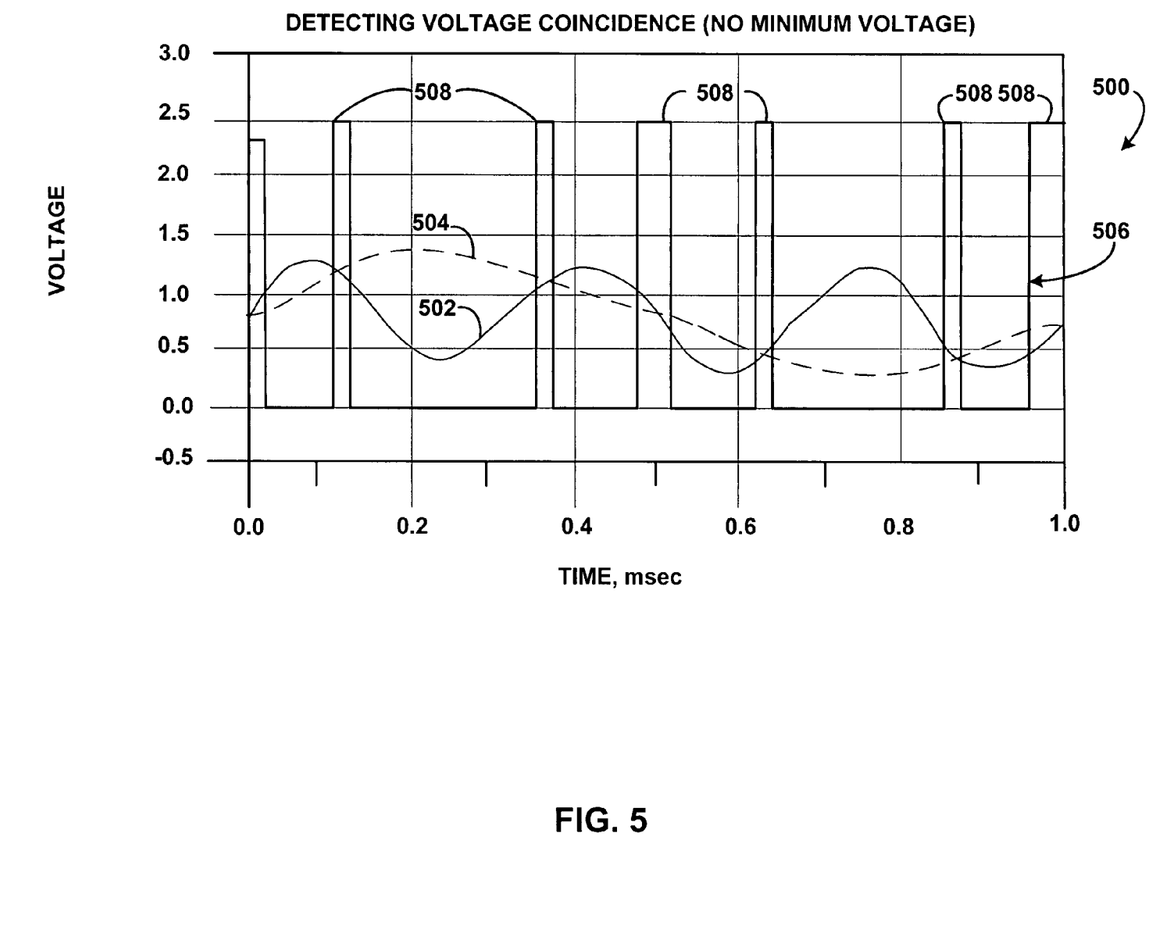
FIG. 5 is a graph illustrating signal coincidence detection using the circuit of FIG. 2 with no threshold adjustment.

Referring now to FIG. 5, a graph 500 illustrating the operation of the circuit 200 in detecting coincidence of input signals 502 and 504 is shown. In the graph 500, the trace 506 is the digital output signal of the circuit 200. For this particular example, the signal buffer 150 of the circuit 200 is implemented as an inverter. Also in this example, the threshold adjustment device 160 is off (e.g., 0 V is applied to the gate of the FET 280). Therefore, in this situation, the circuit 200 will indicate the coincidence of the input signals 502 and 504 at or above approximately 0 V.

In the graph 500, the pulses 508 of the trace 506 indicate that coincidence of the input signals 502 and 504 has been detected by the circuit 200. The width of the pulses 508 indicates the band of coincidence for the circuit 200. As shown in FIG. 5, the width of the pulses 508 varies depending on the relative rate of change of the amplitude of the input signals 502,504 in proximity of actual coincidence of the signals. Actual coincidence may be defined as the voltages of the input signals 502,504 being equal, not just within a coincidence band. If the input signals 502,504 are changing relatively quickly with respect to each other when actual coincidence occurs, the pulse 508 is narrower than if the input signals 502,504 are changing relatively slowly with respect to each when actual coincidence occurs. It will be appreciated that the circuit 200 may indicate that coincidence of the input signals 502 and 504 has occurred without actual coincidence between signals taking place.

Figure 6:
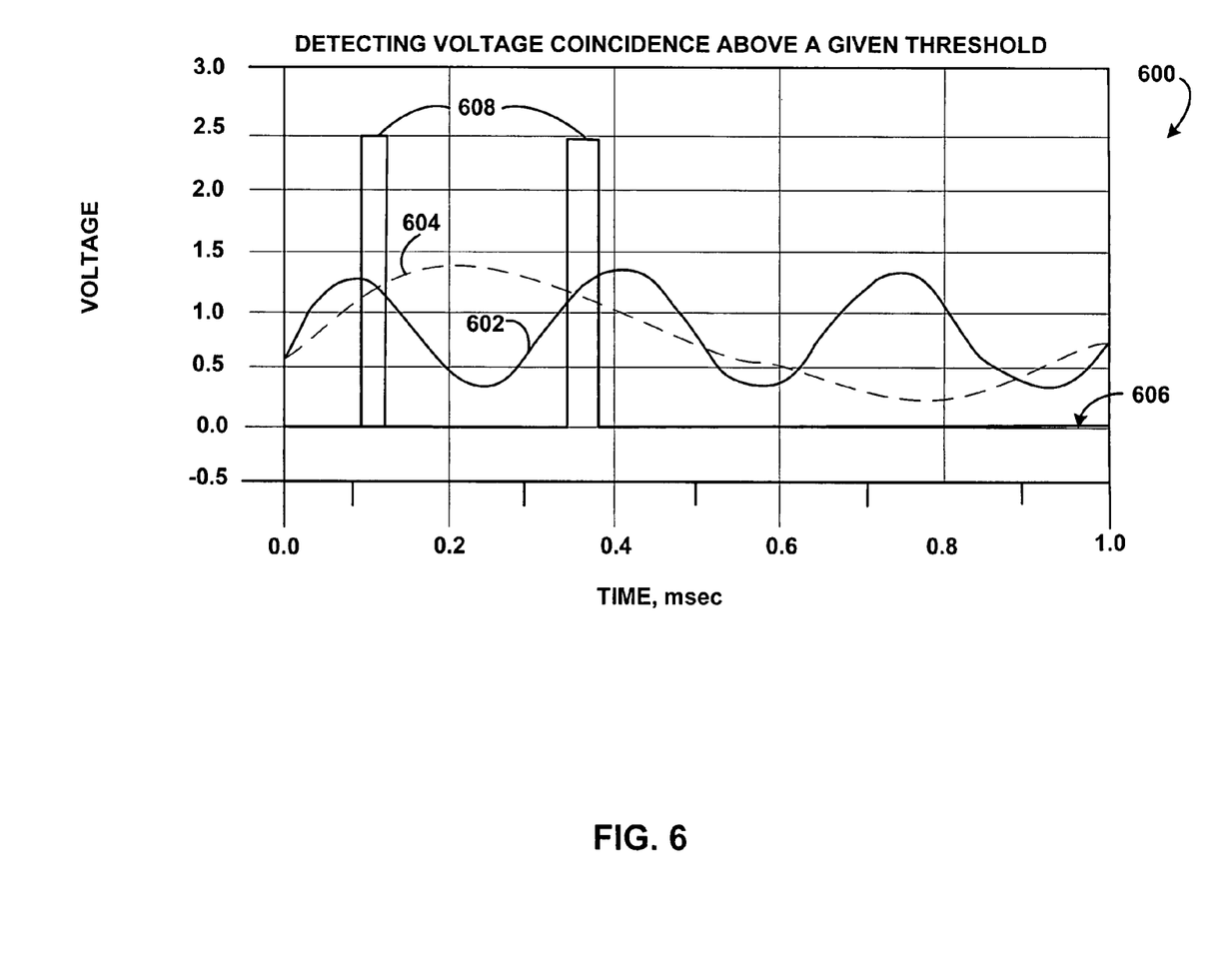
FIG. 6 is a graph illustrating signal coincidence detection using the circuit of FIG. 2 with threshold adjustment.

Referring now to FIG. 6, a graph 600 illustrating the operation of the circuit 200 in detecting coincidence of input signals 602 and 604 is shown. In the graph 600, the trace 606 is the digital output signal of the circuit 200. For this particular example, as with the graph 500 of FIG. 5, the signal buffer 150 of the circuit 200 is implemented as an inverter. Also in this example, the threshold adjustment device 160 is active with a voltage of approximately 1.0V applied to the FET 280. Therefore, in this situation, the circuit 200 will indicate the coincidence of the input signals 602 and 604 at or above approximately 1.0 V.

In the graph 600, the pulses 608 of the trace 606 indicate the coincidence of the input signals 602 and 604 above the threshold voltage of 1.0 V has been detected by the circuit 200. As shown in FIG. 6, coincidence of the input signals 602,604 when the voltage of the signals is below 1.0V (the threshold voltage) does not result in a pulse 608.

CONCLUSION

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

What is claimed is:

1. A signal coincidence detection circuit comprising:
a first differential transistor pair;
a second differential transistor pair coupled with the first differential transistor pair;
a third differential transistor pair coupled with the first differential transistor pair in parallel with the second differential transistor pair;
a first input signal terminal coupled with the first, second and third differential transistor pairs, wherein, in operation, the first input signal terminal receives a first input signal that is communicated to the first, second and third differential transistor pairs;
a second input signal terminal coupled with the first, second and third differential transistor pairs, wherein, in operation, the second input signal terminal receives a second input signal that is communicated to the first, second and third differential transistor pairs; and
a current source coupled with the first differential transistor pair,
wherein, in operation, a plurality of currents of the second and third differential transistor pairs are combined such that the combined currents indicate whether or not coincidence between the first and second input signals exists.

2. The signal coincidence detection circuit of claim 1, wherein, in operation:
the current source supplies a first tail current to the first differential transistor pair;
a first transistor of the first differential transistor pair supplies a second tail current to the second differential transistor pair; and
a second transistor of the first differential transistor pair supplies a third tail current to the third differential transistor pair.

3. The signal coincidence detection circuit of claim 2, wherein:

the first input signal terminal is coupled with a gate terminal of the first transistor of the first differential transistor pair;
the second input signal terminal is coupled with (i) a gate terminal of the second transistor of the first differential transistor pair and (ii) respective gate terminals of respective first transistors of the second and third differential transistor pairs; and
the first input signal terminal is further coupled with respective gate terminals of respective second transistors of the second and third differential transistor pairs.

4. The signal coincidence detection circuit of claim 3, further comprising a current mirror coupled with the second transistor of the second differential transistor pair and the first transistor of the third differential transistor pair, the current mirror operating as a pull-up device in the signal coincidence detection circuit, wherein, in operation, respective currents of the second transistor of the second differential transistor pair and the first transistor of the second differential transistor pair are combined and mirrored by the current mirror to indicate whether or not coincidence between the first and second input signals exists.

5. The signal coincidence detection circuit of claim 3, further comprising a threshold adjustment device coupled with the current mirror, wherein varying a resistance of the threshold adjustment device establishes a voltage threshold below which the signal coincidence circuit will not indicate coincidence of the first and second input signals.

6. The signal coincidence detector of claim 5, wherein the threshold adjustment device comprises an n-type field effect transistor.

7. The signal coincidence detection circuit of claim 3, further comprising:
a first current mirror coupled with the first transistor of the second differential transistor pair and the second transistor of the third differential transistor pair; and
a second current mirror coupled with the first current mirror, the second current mirror operating as a pull-down device in the signal coincidence detection circuit, wherein, in operation:
respective currents of the first transistor of the second differential transistor pair and the second transistor of the third differential transistor pair are combined and mirrored by the first current mirror; and
a current of the first current mirror is mirrored by the second current mirror to indicate whether or not coincidence between the first and second input signals exists.

8. The signal coincidence detection circuit of claim 1, further comprising:
a third current mirror coupled with the second transistor of the second differential transistor pair and the first transistor of the third differential transistor pair, the third current mirror operating as a pull-up device in the signal coincidence detection circuit, wherein, in operation, respective currents of the second transistor of the second differential transistor pair and the first transistor of the second differential transistor pair are combined and mirrored by the third current mirror to indicate whether or not coincidence between the first and second input signals exists; and
a signal buffer coupled with the second and third current mirrors, wherein, in operation, the signal buffer produces a digital signal based on currents of the second and third current mirrors, the digital signal indicating whether or not coincidence between the first and second input signals exists.

9. The signal coincidence detector of claim 8, wherein the signal buffer comprises an inverter circuit.

10. The signal coincidence detection circuit of claim 1, wherein the current source comprises first and second n-type field effect transistors (FETs), wherein:
   a source terminal of the first n-type FET is coupled with electrical ground;
   a drain terminal of the first n-type FET is coupled with a source terminal of the second n-type FET; and
   a drain terminal of the second n-type FET is coupled with respective source terminals of first and second transistors of the first differential transistor pair.

11. The signal coincidence detection circuit of claim 10, further comprising a cascoded voltage bias generator coupled with respective gate terminals of the first and second n-type FETs, wherein, in operation, the current source mirrors respective currents of one or more reference current sources being conducted by the bias generator.

12. A signal coincidence detection circuit comprising:
   a first differential transistor pair;
   a current source coupled with the first differential transistor pair such that, in operation, the current source supplies a first tail current to the first differential transistor pair;
   second and third differential transistor pairs coupled with the first differential transistor pair such that, in operation, a first transistor of the first differential transistor pair supplies a second tail current to the second differential transistor pair and a second transistor of the first differential transistor pair supplies a third tail current to the third differential transistor pair;
   a first input signal terminal coupled with the first, second and third differential transistor pairs, wherein, in operation, the first input signal terminal receives a first input signal that is communicated to the first, second and third differential transistor pairs; and
   a second input signal terminal coupled with the first, second and third differential transistor pairs, wherein, in operation, the second input signal terminal receives a second input signal that is communicated to the first, second and third differential transistor pairs,
   wherein, in operation, currents of the second and third differential transistor pairs indicate whether or not the first and second input signals are coincident.

13. The signal coincidence detection circuit of claim 12, wherein currents of the second and third differential transistor pairs are combined to produce a plurality of combined currents, the combined currents indicating whether or not the first and second input signals are coincident.

14. The signal coincidence detection circuit of claim 12, further comprising:
   a signal buffer that, in operation, receives the combined currents and generates a digital output signal indicating whether or not the first and second input signals are coincident.

15. The signal coincidence detection circuit of claim 14, wherein the combined currents are communicated to the signal buffer via a plurality of current mirrors.

16. The signal coincidence detection circuit of claim 15, wherein the signal buffer comprises a hex-buffer circuit.

17. The signal coincidence detection circuit of claim 12, further comprising a threshold adjustment device coupled with the second and third differential transistor pairs, wherein varying a resistance of the threshold adjustment device establishes a voltage threshold below which the signal coincidence circuit will not indicate coincidence of the first and second input signals.

18. A method of determining signal coincidence, the method comprising:
   receiving a first input signal;
   receiving a second input signal;
   applying the first and second input signals to first, second and third differential transistor pairs, wherein a tail current of the first differential transistor pair is provided by a current source, a tail current of the second differential transistor pair is provided by a first transistor of the first differential transistor pair and a tail current of the third differential transistor pair is provided by a second transistor of the first differential transistor pair;
   combining currents of the second and third differential transistor pairs to produce first and second combined currents; and
   communicating the first and second combined currents to a signal buffer, the signal buffer producing a digital signal based on the first and second combined currents, the digital signal indicating whether or not the first and second input signals are coincident.

19. The method of claim 18, wherein communicating the first and second combined currents to the signal buffer comprises mirroring the first and second combined currents to the signal buffer.

20. The method of claim 18, further comprising:
   varying a resistance of a threshold adjustment device coupled with the second and third differential transistor pairs to establish a voltage threshold above which coincidence of the first and second input signals is indicated by the digital signal.

* * * * *